United States Patent [19]

Hashimoto et al.

[11] Patent Number: 4,759,948
[45] Date of Patent: Jul. 26, 1988

[54] FILM FORMATION THROUGH CO-DEPOSITION WITH HIGH AND LOW ENERGY BEAMS

[75] Inventors: Isao Hashimoto; Yuzo Oka, both of Hitachi, Japan

[73] Assignee: Hitachi, Ltd., Tokyo, Japan

[21] Appl. No.: 8,252

[22] Filed: Jan. 29, 1987

[30] Foreign Application Priority Data

Jan. 29, 1986 [JP] Japan .................................. 61-17303

[51] Int. Cl.$^4$ ............................................. B05D 3/06
[52] U.S. Cl. ....................................... 427/38; 427/47
[58] Field of Search .................................... 427/38, 47

[56] References Cited

FOREIGN PATENT DOCUMENTS 58-2022  1/1983  Japan .

OTHER PUBLICATIONS

Ota, pp. 1102–1110, J. Appl. Phys., vol. 51, No. 2, Feb. 1980, Silicon Molecular Beam Epitaxy with Simultaneous Ion Implant Doping.

*Primary Examiner*—Bernard D. Pianalto
*Attorney, Agent, or Firm*—Antonelli, Terry & Wands

[57] ABSTRACT

Manufacturing of film through co-deposition with a high-energy beam and a low-energy beam. The low-energy beam is produced by electron beam heating or resistance heating. The high-energy beam is produced by a bucket-type ion source in which a magnetic field of multi-cusp-like configuration are employed and is composed of pulse trains in which each pulse has a duration not longer than 10 sec. and preferably in a range of 1 to 100 msec. The high-energy beam serves to clean the surface of the workpiece and form a mixed layer at interface between the workpiece and the deposited film. A film having a high quality and a strong adhesion can be obtained.

15 Claims, 3 Drawing Sheets

FIG. 4A  TEMP.
FIG. 4B  ION BEAM CONTROL
FIG. 4C  SHUTTER
FIG. 4D  EB EMISSION
FIG. 4E  ION BEAM
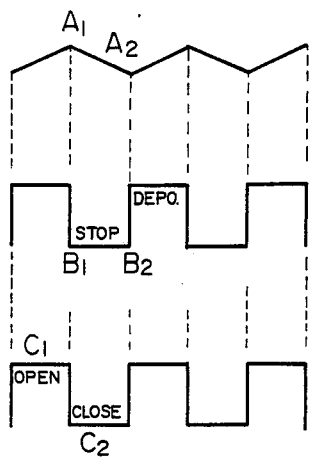

FILM FORMATION THROUGH CO-DEPOSITION WITH HIGH AND LOW ENERGY BEAMS

BACKGROUND OF THE INVENTION

1. Field of the Invention

The present invention generally relates to a film forming technique and more particularly concerns a technique of forming a thin film by using concurrently a high-energy beam and a low-energy beam in combination.

2. Description of the Related Art

As the thin-film forming techniques, there have been known a variety of methods such as, for example, vacuum evaporation, sputtering, chemical vapor deposition, ion beam deposition, ion implantation and the others. In the vacuum evaporation process, a source material is vaporized under resistance heating or electron beam heating, whereby vaporized molecules (atoms) are deposited on a substrate. Energy of the particles (molecules, atoms) impinging on the substrate is primarily determined by thermal energy given by $3/2 \cdot kT$ where T represents the heating temperature in degrees Kelvin. According to the sputtering method, primary particles are caused to collide against a target to physically sputter the material constituting the target in the form of particles (molecules) which are then deposited on a substrate disposed in opposition to the target. Plasma sputtering in which plasma is used as a primary particle source is widely employed. By confining the plasma with a magnetron-type magnetic field, the sputtering rate can be increased. Although the particle beams for depositon by the process mentioned above have certain levels of energy, they are substantially incapable of sputtering the substrate-constituting molecules from the substrate surface.

In the ion beam deposition, ions are accelerated into an ion beam to irradiate a substrate, whereby ionized particles are deposited on the substrate. The ion beam comprises particles of an energy from several hundreds to several thousands electron volts. In ion implantation, ions are accelerated and implanted into a substrate. Thus, the particles (ions) usually have a considerably high energy (on the order of 1 KeV to 100 KeV). Particles of high energy injure the substrate as they are implanted into the substrate and sputter the same. For evading such sputter phenomenon, the ion accelerating energy may be lowered to the order of 100 eV.

These various film-forming techniques have respective shortcomings as well as advantages.

An attempt is reported according to which two kinds of techniques are combined to gain more satisfactory result.

Japanese Patent Application Laid-Open No. 2022/1983 (JP-A-NO. 58-2022) discloses a deposition method according to which a metal is evaporated for deposition by using a electron beam, while ions of a substance such as nitrogen, oxygen, hydrogen or the like which forms a metallic compound with the above-mentioned metals are caused to irradiate a film by using a mass-analyzed ion implanter. In this connection, it is reported that satisfactory result can be obtained when the ion beam is imparted with sufficiently high energy to bring about the sputter phenomenon.

SUMMARY OF THE INVENTION

An object of the present invention is to provide a novel film-forming technique in which a high-energy beam and a low-energy beam are made use of. In this connection, it is noted that the term "high-energy beam" is used to describe a beam composed of particles having energy higher than about 1 KeV, while the term "low-energy beam" is intended to mean a beam composed of particles of low energy produced by evaporation or the like, in the present specification.

It is another object of the present invention is to provide a technique capable of forming a film at a high production rate by using the high-energy beam and the low-energy beam.

The technique of this kind has heretofore been employed in an apparatus for ion implantation of a current density on the order of several mA at highest as a high-energy beam producing apparatus in the field of semiconductor industry. In applications in which one species of film-forming substance is supplied in the form of an ion beam, the ion beam of the low current capacity as mentioned above imposes serious limitation to the production rate of the film and may exert adverse influence to the quality of the film as formed.

The inventors of the present invention have discovered that a high-energy beam of a large current capacity could be produced by using a bucket-type ion source in which a magnetic field of a multi-cusp-like configuration is generated, which source has been developed in the field of nuclear fusion technology. The low-energy beam of a large capacity can be produced by evaporation process (inclusive of resistance heating, electron beam or EB heating, radiation heating and the like). By using the high-energy beam and the low-energy beam each of a large capacity, it is now possible to form a film of an enhanced quality at a high production rate.

It has also been discovered that the purity of the deposited film is more improved as the film deposition rate is more increased. It is preferred that the deposition rate should be higher than 0.3 Å/sec at the lowest. However, when the deposition rate was excessively high, there arose a problem that the concentration of impurities mixing into the film being formed increases as a function of time lapse.

It has been found that the above-mentioned difficulty can be essentially overcome by using a pulse-like high-energy beam for irradiating the substrate. More specifically, instead of irradiating the substrate with the high-energy beam in a continuous manner, the high-energy beam is shaped into the form of a pulsed beam, wherein the pulse length is selected in a range of 1 msec to 10 sec and more preferably 1 msec to 100 msec. The duty cycle is preferably selected from ½ to 1/10. It is desirable that the high and low energy beams mix completely in the film. Thus, the duty may be related with the deposition rate of the low energy beam. By repetitively radiating the substrate with the beam pulses, it has been found that the content of the impurities in the film being formed can be reduced. Although the low-energy beam can also be produced in the form of pulses, this is not compulsory.

For this purpose, the pulse-like high-energy beam of the high current capacity may be accomplished by controlling appropriately the plasma producing electrodes or ion extracting electrode(s) of the bucket-type ion source. In this manner, mixing or inclusion of impurities in the film being grown can be suppressed to a possible minimum while maintaining the deposition rate as high as possible.

The deposition with the aid of the high-energy beam is accompanied with generation of a large amount of heat. Even when the heat dissipating means is provided, it may happen that the amount of heat generated exceeds that of heat dissipated, increasing the temperature of the substrate excessively, when the deposition rate is increased.

To dispose of the problem mentioned above, it is desirable that the deposition with the high-energy beam is once interrupted and started again after the temperature of substrate has been lowered. To this end, the substrate temperature may be monitored by means of, for example, a thermocouple, radiation thermometer or the like. When the substrate temperature exceeds a predetermined point $T_1$, the deposition by the high-energy beam is stopped and started again after the substrate temperature has been lowered below a temperature $T_2$ ($<T_1$). During deposition process, the irradiating high-energy beam is in the form of a pulsed beam. During the period in which the deposition by the high-energy beam is interrupted, the deposition with the low-energy beam may also be stopped.

The high-energy beam has an ability to sputter the substrate. By making use of this sputtering ability positively, adhesion of the film to the substrate can be significantly enhanced. By irradiating the substrate with only the high-energy beam in precedence to the film deposition, it is possible to provide a clean surface on the substrate. It is further noted that the high-energy beam penetrates into the substrate (and the deposited film) in the initial phase to form a mixed layer. This mixed layer which defines a transition region from the substrate to the deposited film contributes to increasing the adhesion of the film to the substrate.

BRIEF DESCRIPTION OF THE DRAWINGS

FIGS. 2A and 2B are diagrams showing waveforms of a signal for controlling the high-energy beam used for the film formation by deposition according to two embodiments of the invention, respectively, wherein FIG. 2A shows a waveform of successive pulses, and FIG. 2B shows an intermittent pulse waveform;

FIGS. 4A to 4E are waveform diagrams for illustrating the deposition process taking place in the apparatus shown in FIG. 3.

DESCRIPTION OF THE PREFERRED EMBODIMENTS

Figure 1:
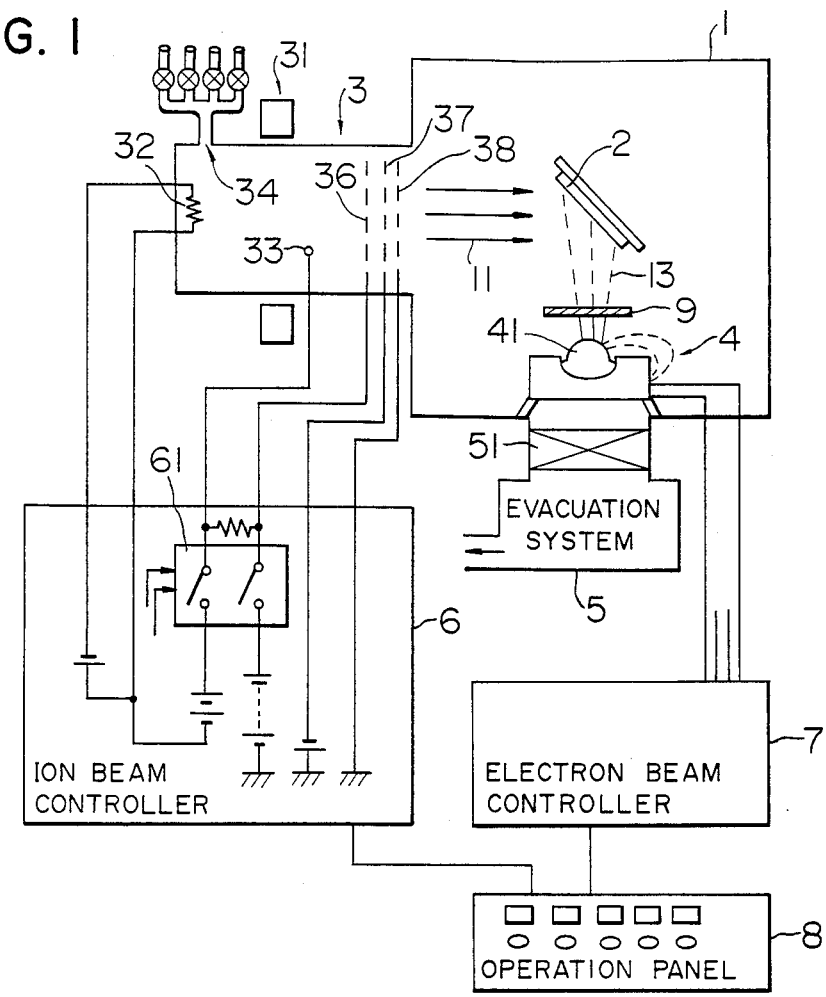
FIG. 1 is a schematic diagram showing a general arrangement of an apparatus for carrying out the deposition by using the high-energy beam and the low-energy beam according to an exemplary embodiment of the present invention.

FIG. 1 shows schematically a general arrangement of a film forming apparatus. In FIG. 1, a vacuum vessel 1 can be evacuated and a supporting structure on which a specimen (substrate) 2 is mounted is disposed within the vacuum vessel. The supporting mechanism includes a rotating mechanism, cooling means and others (not shown). Connected to the vacuum vessel 1 is an ion source 3 which includes an arc electrode 33, a plasma electrode 36 and a beam extracting electrode 37. An ion source controlling circuit 6 including a high-speed switch device 61 is connected to the ion source 3. In the ion source 3, there are disposed a filament 32 and the arc electrode 33 within a space in which a magnetic field of a multi-cusp-like configuration is generated. Electrons emitted from the filament 32 are accelerated under the influence of the arc electrode 33, whereby a gas such as $N_2$, $O_2$, $H_2$, air, Ar, Xe or other selectively introduced into the plasma source 3 through an inlet port 34 is ionized to form a plasma.

A high potential is applied to the plasma electrode 36 for producing the high-energy ion beam 11. As viewed from the vacuum vessel 1, a grounded electrode 38 and the beam extracting electrode 37 cooperate to form a potential barrier to prevent the electrons from flowing in the reverse direction.

An evacuation system 5 is connected to the vacuum vessel 1 for forming vacuum within the vacuum vessel 1. An evacuating system suited for the intended application may be selected from various evacuation systems such as a combination of a turbo-molecular pump and an auxiliary pump, a combination of a cryopump or an oil diffusion pump and an auxiliary pump and the like so that the vacuum pressure within the vacuum vessel during the period in which the deposition process is interrupted can be maintained at most on the order of $10^{-4}$ Pa and preferably lower than $10^{-5}$ Pa (higher vacuum). The evacuation system can be separated from the vacuum vessel 1 by means of a main valve 51.

Disposed within the vacuum vessel 1 is an electron gun 4 for evaporating a solid material 41 which constitutes one of film forming substances. The solid material 41 may be for forming an $Al_2O_3$-film, Ti for forming a TiN-film, Si for forming a SiN silicon nitride film, B for forming a BN-film or the like. However, it is not intended to exclude other solid or liquid substance at a room temperature from the use. The source material 41 is molten to be vaporized under bombardment by the electron beam. However, it is not intended to exclude the material which sublimates straightforwardly from the solid state.

A shutter 9 is provided between the electron gun 4 and the specimen 2. This shutter 9 should preferably be closed before starting the deposition process by evaporating the source material 41 or during the interruption of the deposition process to thereby close the beam path extending from the electron gun 4 to the substrate 2.

The electron gun 4 is controlled by an electron gun (beam) controller 7 which is interconnected with the ion beam controller 6. The ion beam 11 and the evaporated particle beam 13 can be controlled in synchronism with each other. By way of example, ion beam generation and the shutter 9 may be so synchronized that the irradiation with the ion beam may be started simultaneously with the irradiation with the evaporated substance beam.

It is preferred that the vacuum within the vacuum vessel 1 be maintained at most on the order of about $10^{-3}$ Pa to $10^{-2}$ Pa even during deposition.

The ion beam 11 is extracted from the ion source 3 and is irradiated in the specimen 2. Energy of the ions can be controlled by controlling the accelerating voltage applied to the plasma electrode 36. The pulsing of the ion beam 11 can be carried out by turning on/off the power supply to the arc electrode 33 or by turning on/off the power supply to the plasma electrode 36 under the control of the ion beam controller circuit 6. When the power supply to the arc electrode 33 is turned off, production of plasma is stopped, which means naturally that the ion beam 11 disappears. When only the voltage applied to the plasma electrode 36 is turned off the ion beam 11 is no more produced although the plasma is produced. Thus, by breaking the power supply to at least one of the arc electrode 33 and the plasma electrode 36, the ion beam 11 can be stopped. In this connection, it is however noted that there are cases where breaking of the power supply to the arc electrode 33 is preferred.

Figure 2A:
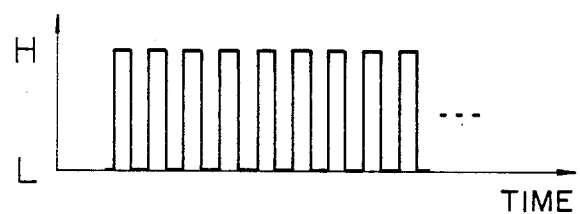

In this manner, the ion beam is controlled by the control signal generated by the ion beam controller 6. By way of example, irradiation with the accelerated ions may be performed when the control signal produced by the ion beam controller 6 is at high level, while irradiation with the accelerated ions may be stopped when the control signal is at low level. More specifically, the ion beam controller 6 may supply a pulse-like signal of the waveform illustrated in FIG. 2A to the ion source 3 so that the irradiation with ions can take place when the signal level is high while irradiation with ions can be stopped when the signal level is low.

In general, it is preferred that the ion current is as large as possible during irradiation. Impurity concentration in the film being formed tends to decrease as the deposition rate is varied to increase with other given conditions being constant. The current capacity of the ion source 3 of the bucket type employed in the illustrated embodiment of the invention may be from 0.1 ampere to several amperes and is larger than that of an ion implanter employed for impurity implantation in semiconductor, e.g. by a factor of about 1,000, in view of the fact that the current capacity of the ion implanter is ordinarily on the order of mA. Thus, the deposition rate of the high-energy beam which is a major rate-determining factor in most cases can be increased, whereby the deposition rate can be correspondingly enhanced as a whole. It is believed that a film of an improved quality can be formed with the increased deposition rate since then the deposition is more insusceptible to the influence of the residual gas within the vacuum space.

It has however been found that the concentration of impurities mixing into the film being formed is progressively increased when irradiation is performed continuously with tne high-energy beam of a high current capacity for some unknown reasons. Such increasing of the impurity concentration can be minimized by intermittently interrupting the high-energy beam in the form of pulses. It is believed that during the period in which the irradiation with the accelerated ions is stopped, the impurity gas is removed from the vacuum vessel through the evacuation system. In other words, the film of high quality can be manufactured at a high productivity on the commercial basis through deposition with a high instantaneous deposition rate by intermittently interrupting the high-energy beam so as to allow the impurities produced due to the deposition to be sequentially removed while evading the influence of the residual gases within the vacuum space. The period of the pulse or the pulse length should preferably be selected in range of 1 msec to 10 sec and more preferably in a range of 1 msec to 100 msec, although it depends on the conditions for deposition.

The high-energy beam will penetrate into the substrate (inclusive of the film deposited thereon) by its nature. The depth of penetration is primarily determined in dependence on the material of the substrate, size of the particles and energy (accelerating voltage). As the result, there is formed on the substrate surface a mixed layer of the substrate material and the deposited beam substance (in particular, the high-energy beam-forming substance). In general, such mixed layer exhibits a good intimacy to both the substrate and the deposited layer and serves to bond intimately them. Thus, the co-deposition layer formed by using both the low-energy beam and the high-energy beam exhibits significantly increased adhesion.

However, he substrate surface is contaminated more or less. By way of example, the metallic surface is ordinarily formed with a native oxide layer. Further, the surface exposed to the ambient atmosphere is susceptible to contamination of grease or oils.

In addition to the cleaning of the substrate in precedence to the deposition process, it is preferred in many cases that the substrate surface be cleaned or activated. To this end, the substrate may be bombarded with the high-energy beam before deposition is performed.

In general, the sputtering yield of the accelerated particles is increased with energy and assumes a high value in the energy range of about 10 KeV to about 100 KeV. For this reason, it is preferred in many cases to use the particle beam having energy on the order mentioned above for cleaning the substrate surface.

Concerning the species or type of ion, inert ions such as argon or the like may be selected. Of course, nitrogen, oxygen or the like ions which are employed for the subsequent deposition may be used for the cleaning purpose. By way of example, when an TiN-film is to be grown on the surface of a machining tool, the tool surface may be bombarded with argon ions or nitrogen ions of energy in the range of ca. 1 KeV to ca. 10 KeV in precedence to the deposition for forming the TiN-film.

EXAMPLE 1

The main valve is closed and workpieces of iron are mounted within the vacuum vessel 1. After the vacuum vessel has been hermetically closed, the main valve is opened to evacuate the vacuum vessel to $10^{-5}$ Pa. By controlling the electron beam gun 4, the target 41 of Al is irradiated with the electron beam to melt Al to thereby allow an Al-beam of the low energy to be emitted. Nitrogen gas is charged through the gas inlet 34 and the plasma of nitrogen ions is produced by controlling the ion source 3. The nitrogen ions are accelerated at about 10 KV for bombardment of the workpieces with the accelerated ions. By controlling the accelerating voltage, the ion beam is transformed to beam pulses each having a pulse width of about 50 msec. The workpieces are irradiated with the pulses of the nitrogen ion beam of 20 KeV while irradiating the workpieces with the Al-beam from the electron beam gun. The ion beam controller 6 and the electron gun controller 7 are so controlled that the film of Al-nitride is deposited with a deposition rate of 10 Å/sec. To this end, a correspondingly prepared control program may be previously inputted through the manipulation panel 8.

EXAMPLE 2

In the abovementioned example 1, C is used in place of Al with the nitrogen ions replaced by Ar-ions. In this case, although Ar is considered not to contribute in composing the film, it seems that Ar will participate in crystallization of carbon. It is estimated that i-carbon can be produced.

EXAMPLE 3

By using Si in place of Al in example 1, an insulating amorphous silicon nitride film is formed.

Although it depends on the conditions for the film formation, there may arise such a case in which the temperature of the substrate has to be limited. Tools made of steel, for example, might be annealed at a temperature of aobut 500° C. An Al-Si alloy may have a transformation point in a range of about 150° C. to about 170° C. at which the magnetic properties thereof can be changed. Many of plastic materials can not be subjected to a temperature higher than about 150° C. to 200° C. When the heat dissipation is limited due to low heat conductivity, there may arise a danger of the substrate temperature increasing excessively.

Figure 2B:
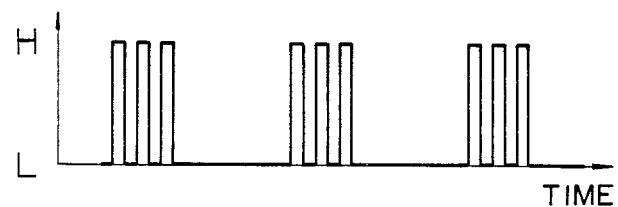

Thus, when limitation is imposed on the substrate temperature and sufficient heat dissipating capability is not available, a problem arises as to how the deposition should be carried out. Reduction of the instantaneous deposition rate itself is not preferred because otherwise the increased impurity concentration of the film will be incurred as described hereinbefore. Although the duty ratio of the pulse beam for deposition may be reduced, there is present a limit. In case the deposition with the high-energy beam is continued, the substrate temperature will rise excessively. Under the circumstances, it is desirable to stop intermittently the deposition with the high-energy beam pulses in order to prevent the substrate temperature from rising beyond a predetermined level. A control signal to this end is schematically illustrated in FIG. 2B. During the deposition, the high-energy beam is applied in the form of pulses as in the case of the example described hereinbefore. It has been found that the intermittent interruption of the beam irradiation is preferred over the decreasing of the instantaneous deposition rate.

The interval at which the irradiation with the ion beam is performed can be controlled in accordance with a program loaded previously through the input device 8 so that the substrate temperature can be prevented from rising excessively. In that case, during a period in which irradiation with the ion beam is not performed, a control signal is supplied to the electron gun controller 7 from the ion source power supply 6. The electron gun controller 7 responds to reception of this control signal to close the shutter 9 of the evaporation system and decrease the emission rate of the electron gun. It is however not desirable to decrease the emission rate down to zero even when the ion implantation does not take place, because otherwise the temperature of the substance for evaporation will be lowered excessively.

For preventing more positively the substrate temperature from being increased excessively, it is preferred to monitor the temperature of the substrate. The monitoring of the substrate temperature may be realized by disposing a thermocouple on the rear surface of the substrate. More preferably, the substrate temperature may be measured by measuring radiation from the exposed surface of the substrate in a contactless manner.

Figure 3:
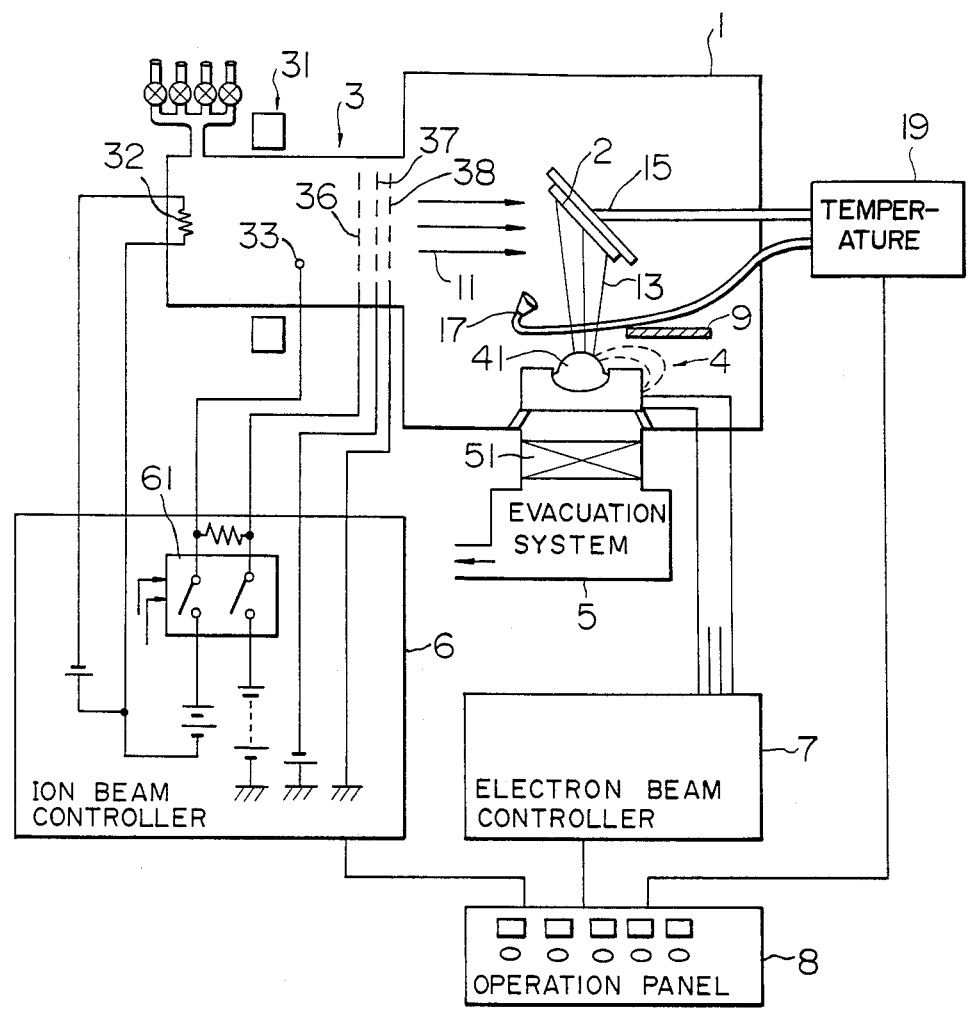
FIG. 3 is a schematic diagram showing an apparatus for carrying out film deposition by using a high-energy beam and a low-energy beam according to another embodiment of the present invention.

FIG. 3 shows a structure of the co-deposition apparatus equipped with a temperature measuring system according to another embodiment of the present invention. This apparatus differs from the one shown in FIG. 1 in that a temperature sensing circuit 19 including a thermocouple 15 for measuring the temperature of the specimen 2 and a light collecting fiber 17 is provided, wherein a signal outputted from the temperature sensing circuit 19 is inputted to the ion beam controller 6 through the control panel 8. The temperature measurement can be accomplished with the aid of either one of the thermocouple 15 or optical fiber 17 or alternatively other means may be employed.

According to the instant embodiment, the temperature of the specimen 2 can be measured by means of the temperature sensing circuit 19 additionally to the operations carried out by the apparatus according to the preceding embodiment. In connection with the temperature measurement, upper and lower limits of the temperature can be previously set from the control panel 8. When the temperature of the specimen 2 is increased due to implantation with the accelerated ions to attain the preset upper limit, a control signal is applied to the ion beam controller 6 from the manipulation panel circuit 8. In response to this control signal, the ion source 3 receives a control signal from the ion beam control circuit 6 to stop the irradiation with the accelerated ions. This operation will be elucidated below in detail by referring to FIGS. 4A to 4E.

FIG. 4A is a view graphically illustrating change in temperature of the specimen brought about by the irradiation with ions. FIG. 4B shows the waveform of a signal for controlling the irradiation with ions which signal is produced on the basis of the temperature change shown in FIG. 4A. As will be seen, when the substrate temperature rises up to a preset upper limit temperature ($A_1$) under irradiation by ions, the irradiation with ions from the ion source 3 is stopped ($B_1$). When the temperature of the substrate thus lowered attains a preset lower limit temperature ($A_2$), the irradiation with ions is restarted ($B_2$). During a period in which irradiation with ions takes place, the shutter 9 of the evaporation system is also set to the open state ($C_1$) as is shown in FIG. 4C, while during the interruption of the irradiation with ions, the shutter 9 of the evaporation system is set to the closed state ($C_2$). On the other hand, in the course of the irradiation with ions, the emission rate of the evaporation system is set to high level ($D_1$) as is shown in FIG. 4D, while the emission rate is set to low state ($D_2$) during the stoppage of the irradiation with ions.

Irradiation with the accelerated ions during the period of irradiation is performed in the pulse-like form as is shown in FIG. 4E. The pulse duration should preferably be 1 msec to 10 sec, and more preferably 1 msec to 100 msec. The duration or run of irradiation is usually set at least at 1 sec, although it depends on the material of the substrate and other factors.

As will be appreciated from the foregoing description, the irradiation with accelerated ions can be stopped when the sensed temperature of the specimen 2 is too high according to the embodiment described just above. By virtue of this feature, the specimen surface can be formed with a film of excellent quality in respect to the purity, precision and the constituent composition.

EXAMPLE 4

A TiN-film is deposited on the substrate of an Al/Si-alloy. Since the transformation temperature of this alloy lies in the vicinity of 170° C., the temperature is so controlled that the level of about 150° C. is not exceeded as measured at the rear surface of the substrate. The deposition rate in forming the film is selected at about 10 Å/sec. Ion current density is about 1.5 mA/cm$^2$. Further, control is made such that the pulse width is 50 msec and the duty ratio is ⅓ to form a pulse train having a period of 150 msec and the duration of a single irradiation run is 20 to 30 sec.

We claim:

1. A method of forming a film on a workpiece in the evacuated atmosphere, comprising steps of:

mounting the workpiece within a vessel capable of being evacuated;

evacuating said vessel;

producing a train of pulses of high-energy beam to irradiate said workpiece; and producing a low-energy beam to irradiate said workpiece.

2. A method of forming a film on a workpiece according to claim 1, wherein said workpiece is irradiated concurrently with both of said high-energy and low-energy beams during a same period.

3. A method of forming a film on a workpiece according to claim 2, further including a step of irradiating the workpiece with only the high-energy beam in precedence to co-deposition with said high-energy beam and said low-energy beam.

4. A method of forming a film on a workpiece according to claim 1, wherein said high-energy beam is constituted by particles having energy not lower than 1 KeV.

5. A method of forming a film on a workpiece according to claim 4, wherein said particles are ions produced from a gaseous substance.

6. A method of forming a film on a workpiece a according to claim 5, wherein said gaseous substance is one selected from a group consisting of oxygen, nitrogen, hydrogen and mixtures thereof.

7. A method of forming a film on a workpiece according to claim 1, wherein said low-energy beam is produced by heating a solid material.

8. A method of forming a film on a workpiece according to claim 7, wherein heating is accomplished by means of an electron beam.

9. A method of forming a film on a workpiece according to claim 1, wherein said high-energy beam and said low-energy beam are so controlled in respect to the quantity that a predetermined ratio of component can be realized when deposited on the workpiece.

10. A method of forming a film on a workpiece according to claim 9, wherein substance constituting said high-energy beam and substance constituting said low-energy beam are combined to form a compound in the deposite film.

11. A method for forming a film on a workpiece according to claim 1, wherein the vessel is a hermetically sealed vessel, and further comprising the steps of supporting the workpiece within the vessel, utilizing a low-energy beam source disposed within the vessel to produce the low-energy beam constituted by particles of low energy to irradiate the workpiece, utilizing a bucket-type ion source connected to the vessel and including magnets for forming a magnetic field of a multi-cusp configuration for producing the high-energy beam constituted by particles of high energy, utilizing a control circuit for controlling the bucket-type ion source to produce the train of pulses of the high-energy beam to irradiate the workpiece, and irradiating the workpiece with the high-energy beam and the low-energy beam to form a film on the workpiece.

12. A method of forming a film on a workpiece according to claim 1, wherein the step of producing a train of pulses of high-energy beam includes producing a train of pulses having a pulse duration of 1 msec to 10 msec.

13. A method of forming a film on a workpiece according to claim 12, wherein the step of producing a train of pulses of high-energy beam includes producing pulses having a duration of 1 msec to 100 msec.

14. A method of forming a film on a workpiece according to claim 12, when the steps of producing a train of pulses of high-energy beam and producing a low-energy beam includes producing a high-energy beam composed of particles having energy higher than about 1 Kev and producing a low-energy beam composed of particules of low energy produced by evaporation.

15. A method of forming a film on a workpiece according to claim 1, when the steps of producing a train of pulses of high-energy beam and producing a low-energy beam includes producing a high-energy beam composed of particles having energy higher than about 1 Kev and producing a low-energy beam composed of particles of low energy produced by evaporation.

* * * * *